United States Patent
Ibaraki et al.

(10) Patent No.: US 7,534,282 B2
(45) Date of Patent: May 19, 2009

(54) HIGH PURITY METAL MO COARSE POWDER AND SINTERED SPUTTERING TARGET PRODUCED BY THEREOF

(75) Inventors: Masayuki Ibaraki, Toyonaka (JP); Kenji Iwamoto, Toyonaka (JP)

(73) Assignee: Japan New Metals Co., Ltd., Osaka (JP)

( * ) Notice: Subject to any disclaimer, the term of this patent is extended or adjusted under 35 U.S.C. 154(b) by 0 days.

(21) Appl. No.: 10/939,156

(22) Filed: Sep. 10, 2004

(65) Prior Publication Data

US 2005/0061106 A1 Mar. 24, 2005

(30) Foreign Application Priority Data

Sep. 16, 2003 (JP) ............................. 2003-322578
Oct. 8, 2003 (JP) ............................. 2003-349396

(51) Int. Cl.
*B22F 1/00* (2006.01)
*B22F 3/00* (2006.01)

(52) U.S. Cl. .......................................... 75/255; 75/246

(58) Field of Classification Search ............... 75/255, 75/245

See application file for complete search history.

(56) References Cited

U.S. PATENT DOCUMENTS

| | | | | |
|---|---|---|---|---|
| 4,595,412 A | * | 6/1986 | Brunelli et al. | 75/363 |
| 4,762,695 A | * | 8/1988 | Endo et al. | 423/54 |
| 4,770,948 A | * | 9/1988 | Oikawa et al. | 428/664 |
| 6,022,395 A | * | 2/2000 | Eckert et al. | 75/365 |

FOREIGN PATENT DOCUMENTS

JP 410183341 * 7/1998

OTHER PUBLICATIONS

Hiraki, Akitoshi. abstract of JP410183341.*

* cited by examiner

*Primary Examiner*—Roy King
*Assistant Examiner*—Ngoclan T Mai
(74) *Attorney, Agent, or Firm*—Darby & Darby P.C.

(57) ABSTRACT

A sintered sputtering target for forming a high purity metal Mo thin film having a remarkably little particle generation is provided. A high purity metal Mo coarse powder as a raw material is provided for making this target. The sintered sputtering target has a theoretical density ratio of 98% or more. The target is obtained by sintering the high purity metal Mo coarse powder. This particle powder has the high purity of 99.99 or more % by mass and an average particle diameter of 5.5 to 7.5 μm.

6 Claims, No Drawings

HIGH PURITY METAL MO COARSE POWDER AND SINTERED SPUTTERING TARGET PRODUCED BY THEREOF

CROSS-REFERENCE

This application claims the benefit of Japanese application no. 2003-322578 filed Sep. 16, 2003 and Japanese application no. 2003-349396 filed Oct. 8, 2003. The above priority applications are incorporated herein in their entirety by reference.

BACKGROUND OF THE INVENTION

1. Field of the Invention

The present invention relates to a sintered sputtering target used for forming a high purity metal Mo thin film, and a high purity metal Mo coarse powder being suitably used as a raw material for making the sintered target powder. The highly pure metal Mo thin film is suitably used for forming a transparent electroconductive film of a flat panel display, such as a liquid crystal display, a gate electrode of a field effect transistor, a wiring circuit, or the like.

2. Description of the Related Art

In a production of the sintered sputtering target for forming the high purity metal Mo thin film, a high purity metal Mo powder having a high purity of 99.99 or more % by mass and an average particle diameter of 2 to 4 μm by the Fischer method has been conventionally used as the raw material powder, (hereinafter, the average particle diameter shows the results by the Fischer method).

Moreover, it has been also known that the high purity metal Mo powder is produced, using a molybdenum trioxide powder, an ammonium molybdate powder or the like, which have the high purity of 99.9 or more % by mass and the average particle diameter of 2 to 4 μm, as the raw material, (hereinafter, these powders are said generically to as a $MoO_3$ powder), forming a molybdenum dioxide powder (hereinafter, it is said to as $MoO_2$) by carrying out a primary hydrogen reduction process to the $MoO_3$ powder under conditions that the predetermined time is kept at 500 to 700 degree C. in a hydrogen gas stream, and carrying out a secondary hydrogen reduction process to the $MoO_2$ powder under conditions that that the predetermined time is kept at 750 to 1100 degree C. in the hydrogen gas stream.

Furthermore, it has been also well known that the sintered sputtering target for forming the high purity metal Mo thin film is produced, using the high purity metal Mo powder, that is, the high purity metal Mo powder having the high purity of 99.99 or more % by mass and the average particle diameter of 2 to 4 μm by the Fischer method as the raw material, and carrying out a hot isostatic pressing (hereinafter, it is said to as HIP) to this Mo powder which is pressed to make a green compact at a pressure of 200 to 300 Mpa. (For example, see Japanese Unexamined Patent Application Publication No. Hei 2-141507)

SUMMARY OF THE INVENTION

In recent years, as for the liquid crystal display, for example, performance increasing, upsizing and size thinning have been progressed remarkably, thus the structure parts of the liquid crystal display, such as the transparent electroconductive film, the gate electrode of the field effect transistor, the wiring circuit or the like, have been remarkably made to have high integration according to the improvement of the liquid crystal display. As the integration degree of these structure parts becomes higher and higher, a high homogeneity is also required to the quality of the high purity metal Mo thin film being suitably used for forming these parts, and especially, the thin film not having particles (a coarse particle being 0.5 μm or more as the maximum diameter) in the film has been strongly required. However, when the high purity metal Mo thin film is formed by using the conventional sintered sputtering target, the particles in the film cannot be reduced to the degree sufficiently corresponding to the high integration of these structure parts in the present condition.

Then, present inventors especially noted the sintered sputtering target used for forming the high purity metal Mo thin film from the above-mentioned viewpoints, and have investigated for reducing a particle generation at the time of forming the thin film. As the result, the following investigated results (a), (b) and (c) are obtained.

(a) The number of the particle generation at the time of sputtering is closely related with a theoretical density ratio of the sintered target, and when the theoretical density ratio of the sintered target is made into 98% or more, the particle generation can be remarkably reduced.

(b) The theoretical density ratio of the sintered target is also closely related with the particle size of the high purity metal Mo powder used for making the sintered target as the raw material powder, and when the average particle diameter of this high purity metal Mo powder is 2 to 4 μm like the conventional high purity metal Mo powder, the sintered target having the theoretical density ratio of 98% or more cannot be made, but when this Mo powder is made to become the coarse particle having the average particle diameter of 5.5 μm or more, the theoretical density ratio of the sintered target can be increased to 98% or more.

(c) In the production of the conventional high purity metal Mo powder, when the high purity metal Mo powder is made from the $MoO_3$ powder, which is the raw material, in the following conditions, the produced high purity metal Mo powder has the high purity of 99.99 or more % by mass, and becomes the coarse particle having the average particle diameter of 5.5 to 7.5 μm. That is, the conditions are the same as the conventional process excepting;

adding a solution containing potassium such as a potassium hydroxide solution, where the ratio of potassium (K) to this raw material is 30 to 150 ppm;

drying it;

mixing it in the condition to cover the K component on the this raw material; and carrying out the secondary hydrogen reduction at a temperature 1150 to 1300 degree C. which is relatively higher than the conventional temperature of 750 to 1100 degree C.

In this case, the particle size of the powder can be grown up to become the coarse particle by the effect of the K component mixed with the raw material and the high reduction temperature in the secondary hydrogen reduction, when the mixing ratio of the K component is 30 to 150 ppm.

The present invention is carried out based on the above-mentioned investigated results, and has the following characteristics.

(a) The high purity metal Mo coarse powder for making the sintered sputtering target, wherein this powder has the high purity of 99.99 or more % by mass and the average particle diameter of 5.5 to 7.5 μm.

(b) The sintered sputtering target for forming the high purity metal Mo thin film having the remarkably little particle generation, wherein said target is sintered by HIP using the high purity metal Mo coarse powder having the high purity of 99.99 or more % by mass and the average particle diameter of 5.5 to 7.5 μm by the Fischer method, and has the theoretical density ratio of 98% or more.

In addition, in the present invention, the theoretical density ratio of the sintered sputtering target is closely related with the average particle diameter of the high purity metal Mo coarse powder used for making this target as mentioned above. When the average particle diameter of the high purity metal Mo coarse powder is less than 5.5 μm, the theoretical density ratio of the sintered sputtering target made by using this coarse powder as the raw material powder becomes less than 98%. When the high purity metal Mo thin film is formed using such a sintered sputtering target having the theoretical density ratio of less than 98%, the number of the particle generation in the thin film is rapidly increased, and this thin film cannot correspond to the high integration satisfactorily. On the other hand, when its average particle diameter becomes 7.5 μm or more, the strength of the produced sintered sputtering target is rapidly decreased, and cracks are easily generated in the target itself during sputtering. Therefore, the average particle diameter of the high purity metal Mo coarse powder is determined as 5.5 to 7.5 μm. Moreover, when this high purity metal Mo coarse powder is used, the sintered sputtering target having the high theoretical density ratio of 98% or more can be made. Furthermore, when this sintered sputtering target is used, the high purity metal Mo thin film having the remarkably little particle generation can be formed.

Furthermore, in the present invention, since the purity of the high purity metal Mo coarse powder used as the raw material powder is made into 99.99 or more % by mass, the sintered sputtering target made by using this powder becomes to have the purity of 99.99 or more % by mass similarly, thus the high purity metal Mo thin film formed by using this target becomes to have the purity of 99.99 or more % by mass. In this case, if the purity of the high purity metal Mo thin film is less than 99.99% by mass, this film cannot be applied to, for example, the liquid crystal display.

According to the present invention, since the high purity metal Mo coarse powder having the high purity of 99.99 or more % by mass and the average particle diameter of 5.5 to 7.5 μm and a specific surface area of 0.07~0.2 m²/g is used as the raw material powder, the sintered sputtering target having the high purity of 99.99 or more % by mass similarly and the theoretical density ratio of 98% or more can be made. Further, when this sintered sputtering target is used, the high purity metal Mo thin film having the remarkably little particle generation can be formed, wherein this thin film can be applied to, for example, the liquid crystal display or the like where the high integration is required.

DETAILED DESCRIPTION OF PREFERRED EMBODIMENT

Next, the present invention is explained concretely with examples.

High purity metal Mo coarse powders of the present invention (hereinafter, these are said to as present invention Mo coarse power) 1 to 5 were made respectively;
using the molybdenum trioxide powders (hereinafter, these are said to as $MoO_3$) having the purity and the average particle diameter, which were shown in Table 1 respectively, as the raw material;
blending a 30% KOH aqueous solution as the source of the K component to this molybdenum trioxide powder, where the ratio of the K component to the $MoO_3$ powder is shown in Table 1 respectively;
mixing and drying it;
making the condition where the K component is covered on the surface of the raw material; and
carrying out the primary and secondary hydrogen reductions keeping with above condition and in the other conditions shown in Table 1 similarly.

Moreover, conventional high purity metal Mo powders (hereinafter, these are said to as conventional Mo powders) 1 to 5 were made respectively for the comparative purpose with the same conditions as those of the present invention Mo coarse particle powers excepting that the K component was not blended to the $MoO_3$ powder being the raw material as shown in Table 1, and the secondary hydrogen reduction temperature was set to 750 to 1100 degree C., which was the conventional temperature.

Further, the measuring results of the purity and average particle diameter of the obtained present invention Mo coarse particle powers 1 to 5 and the conventional Mo powders 1 to 5 were shown in Table 1.

Next, sintered sputtering targets of the present invention (hereinafter, these were said to as present invention targets) 1 to 5 and conventional sintered sputtering targets (hereinafter, these were said to as conventional targets) 1 to 5 were made respectively; using the present invention Mo coarse powders 1 to 5 and the conventional Mo powders 1 to 5 as the raw material powders respectively; carrying out a hydrogen cleaning process to these raw materials in the conditions of keeping two hours at 700 degree C. under hydrogen atmosphere where the atmosphere pressure was 980 Pa; removing the oxides on the powder surfaces; measuring oxygen quantities on the powder surfaces (absorbing oxygen quantities on the powder surfaces); reducing the oxygen quantities to the predetermined quantities within the range of 100 to 150 ppm, which is the oxygen occupying ratio to the whole powders; pressing the powders at the pressure of 250 MPa respectively to make disk-like green compacts having dimensions where the diameters were 900 mm and the height were 12 mm; carrying out a HIP treatment to these disk-like green compacts to be sintered in the conditions that the pressure was 100 MPa, the temperature was 1250 degree C. and the keeping time was two hours; and making targets where the diameters were 890 mm and the thickness were 10 mm by machining.

Moreover, a present invention target 6 was made, using the present invention Mo coarse powder 4 as the raw material powder; carrying out the hydrogen cleaning process to this raw material powder with the same conditions as the above-mentioned conditions; removing the oxide on the powder surface; measuring the oxygen quantities on the powder surface (the absorbing oxygen quantities on the powder surface); reducing the oxygen quantities to 120 ppm, which is the oxygen occupying ratio to the whole powders; carrying out CIP (a cold isostatic pressing) at the pressure of 200 MPa to make a columnar green compact having the dimension where the diameter was 100 mm and the height was 250 mm; pulverizing this columnar green compact by a crusher to be sieved with a sieve having an opening of 2 mm; making the sieved powder into the disk-like green compact with the same production conditions as those of the present invention targets 1 to 5; carrying out the HIP treatment to this disk-like green compact to be sintered; and machining it.

In Table 2, the measured results of the purities and theoretical density ratios of the present invention targets 1 to 6 and the conventional targets 1 to 5 were shown.

Next, the high purity metal Mo thin film (hereinafter, it was said to as the Mo thin film) was formed; brazing the present invention targets 1 to 6 and the conventional targets 1 to 5 on a pure copper packing plate; setting these targets in a DC magnetron sputtering device; setting the glass substrates having 900 mm diameter; and carrying out sputtering under the conditions that the sputtering gas is argon, the pressure of the argon is 0.5 Pa and the sputtering electric power is 43.5 KW. Thereby, the Mo thin films having the thickness of 0.6 μm were formed on the whole surface of the glass substrates.

As for the obtained thin films, the number of particles was measured with an particle counter, wherein these particles had the maximum diameter of 0.5 μm or more and existed in an arbitrary area having 200 mm diameter. The measured result was shown in Table 2 with the average value of five areas.

Clearly from the results shown in Tables 1 and 2, when the present invention Mo coarse powders 1 to 5 having the purities of 99.99 or more % by mass and the average particle diameters of 5.5 to 7.5 μm were used, the present invention targets 1 to 6 having the purities of 99.99 or more % by mass and the theoretical density ratio of 98% or more can be made.

TABLE 1

| | | MoO₃ Powder Containing K | | | Primary Hydrogen Reduction Treatment | | Secondary Hydrogen Reduction Treatment | | Content of | | | |
|---|---|---|---|---|---|---|---|---|---|---|---|---|
| Kinds | | Containing Ratio of K Component (ppm) | Containing Ratio of MoO₃ (% by mass) | Average Particle Diameter (μm) | Temperature (degree C.) | Keeping Time (hour) | Temperature (degree C.) | Keeping Time (hour) | K Component (ppm) | Purity (% by Mass) | Average Particle Diameter (μm) | Specific Surface Area (m²/g) |
| Present Invention Mo Coarse Powder | 1 | 30 | 99.92 | 2.95 | 630 | 4 | 1150 | 5 | 4 | 99.994 | 5.53 | 0.19 |
| | 2 | 59 | 99.91 | 2.85 | 500 | 6 | 1170 | 5 | 6 | 99.993 | 5.96 | 0.17 |
| | 3 | 73 | 99.93 | 3.01 | 550 | 5 | 1200 | 5 | 5 | 99.992 | 6.51 | 0.14 |
| | 4 | 95 | 99.97 | 2.63 | 700 | 3 | 1300 | 5 | 6 | 99.992 | 7.04 | 0.13 |
| | 5 | 150 | 99.98 | 2.92 | 650 | 3.5 | 1250 | 5 | 7 | 99.993 | 7.47 | 0.07 |
| Conventional Mo Powder | 1 | — | 99.95 | 3.01 | 630 | 4 | 750 | 5 | — | 99.995 | 2.05 | 0.97 |
| | 2 | — | 99.97 | 2.90 | 500 | 6 | 830 | 5 | — | 99.993 | 2.51 | 0.89 |
| | 3 | — | 99.93 | 2.85 | 700 | 3 | 940 | 5 | — | 99.992 | 3.03 | 0.71 |
| | 4 | — | 99.94 | 2.86 | 650 | 3.5 | 1010 | 5 | — | 99.995 | 3.48 | 0.63 |
| | 5 | — | 99.96 | 2.91 | 550 | 5 | 1100 | 5 | — | 99.993 | 3.96 | 0.51 |

TABLE 2

| Kinds | | Raw Material Powder Mark | Theoretical Density Ratio (%) | Average Particle Number in Mo Thin Film (piece) |
|---|---|---|---|---|
| Present Invention Targets | 1 | Present Invention Mo Coarse powder 1 | 98.2 | 8 |
| | 2 | Present Invention Mo Coarse powder 2 | 98.4 | 7 |
| | 3 | Present Invention Mo Coarse powder 3 | 98.7 | 6 |
| | 4 | Present Invention Mo Coarse powder 4 | 99.0 | 4 |
| | 5 | Present Invention Mo Coarse powder 5 | 99.2 | 3 |
| | 6 | Present Invention Mo Coarse powder 4 | 99.6 | 1 |
| Conventional Targets | 1 | Conventional Mo Powder 1 | 93.2 | 47 |
| | 2 | Conventional Mo Powder 2 | 93.7 | 38 |
| | 3 | Conventional Mo Powder 3 | 94.2 | 31 |
| | 4 | Conventional Mo Powder 4 | 94.8 | 27 |
| | 5 | Conventional Mo Powder 5 | 95.4 | 21 |

Further, when these present invention targets 1 to 6 were used, the Mo thin film having the remarkably little particle generation can be formed. On the other hand, all conventional targets 1 to 5 being made by using the conventional Mo powders have the theoretical density ratios of less than 98%, wherein these Mo powders have the average particle diameters of 2 to 4 μm although has the purities of 99.99 or more % by mass. Therefore, the Mo thin film being formed by using the conventional targets 1 to 5 has the remarkably many particle generations.

As mentioned above, when the high purity metal Mo coarse powder of the present invention is used as the raw material, the sintered sputtering target having the theoretical density ratio of 98% or more can be made, and the high purity metal Mo thin film having the remarkably little particle generation can be made by using this sintered sputtering target. So, the high purity metal Mo coarse powder of the present invention can be corresponded fully and sufficiently to the performance increasing, the upsizing and the size thinning of, for example, the liquid crystal display.

What is claimed is:

1. A high purity metal powder, comprising:
   a highly pure Mo coarse powder for making a sintered sputtering target,
   wherein said powder has a high purity of 99.99 or more % by mass and an average particle diameter of 5.5 to 7.5 μm, and a specific surface area of 0.07 to 0.2 m²/g, and wherein the highest reduction temperature to form the highly pure Mo coarse powder is between 1150 and 1300 degrees C.

2. A target comprising: a sintered sputtering target for forming a highly pure metal Mo thin film having little particle generation, wherein said target is sintered by HIP by using a highly pure metal Mo coarse powder having a high purity of 99.99 or more % by mass, an average particle diameter of 5.5 to 7.5 μm and a specific surface area of 0.07 to 0.2 m²/g and oxygen quantities occupying ratio to the whole powders is below 150 ppm, and a theoretical density ratio of 98% or more, and where the highest reduction temperature to form the highly pure Mo coarse powder is between 1150 and 1300 degrees C.

3. The high purity metal powder of claim 1, wherein said highly pure Mo coarse powder further comprises 4 to 7 ppm potassium.

4. The high purity metal powder of claim 1, wherein said powder used to form said highly pure Mo coarse powder comprises 30 to 150 ppm potassium.

5. The target of claim 2, wherein said highly pure metal Mo coarse powder further comprises 4 to 7 ppm potassium.

6. The target of claim 2, wherein said powder used to form said highly pure metal Mo coarse powder comprises 30 to 150 ppm potassium.

* * * * *